United States Patent
Watanabe

(10) Patent No.: US 10,559,359 B2
(45) Date of Patent: Feb. 11, 2020

(54) METHOD FOR REWRITING DATA IN NONVOLATILE MEMORY AND SEMICONDUCTOR DEVICE

(71) Applicant: LAPIS Semiconductor Co., Ltd., Yokohama (JP)

(72) Inventor: Tomomi Watanabe, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/158,250

(22) Filed: Oct. 11, 2018

(65) Prior Publication Data

US 2019/0115080 A1    Apr. 18, 2019

(30) Foreign Application Priority Data

Oct. 12, 2017   (JP) ................. 2017-198586

(51) Int. Cl.
*G11C 16/10* (2006.01)
*G06F 12/02* (2006.01)
*G11C 11/56* (2006.01)
*G11C 16/04* (2006.01)

(52) U.S. Cl.
CPC .......... *G11C 16/10* (2013.01); *G06F 12/0246* (2013.01); *G06F 2212/7201* (2013.01); *G06F 2212/7203* (2013.01); *G11C 11/5628* (2013.01); *G11C 16/0483* (2013.01)

(58) Field of Classification Search
CPC .................................. G11C 16/26; G11C 8/12
USPC ........................ 365/185.11, 230.03
See application file for complete search history.

(56) References Cited

U.S. PATENT DOCUMENTS

| | | | | | |
|---|---|---|---|---|---|
| 4,445,177 | A | * | 4/1984 | Bratt | G06F 8/41 712/245 |
| 5,144,692 | A | * | 9/1992 | Baker | G06F 9/5016 710/1 |
| 5,283,868 | A | * | 2/1994 | Baker | G06F 13/387 709/227 |
| 5,386,522 | A | * | 1/1995 | Evans | G06F 11/362 711/209 |
| 5,963,984 | A | * | 10/1999 | Garibay, Jr. | G06F 12/1027 711/202 |

(Continued)

FOREIGN PATENT DOCUMENTS

JP    2009-134682 A    6/2009

*Primary Examiner* — Michael T Tran
(74) *Attorney, Agent, or Firm* — Rabin & Berdo, P.C.

(57) ABSTRACT

In the present invention, a vacant block which is unwritten is identified as a temporary storage block when a writing destination block has already data written. Then, data writing step writing an incoming data to be written into the temporarily storage block, managing step including assigning a pair of the writing destination block and the temporarily storage block an index number which corresponds to the pair, and generating a management table which indicates the index number associating with a physical address indicating a physical position of the temporarily storage block in the nonvolatile memory are performed. In the data writing step, the physical address which corresponds to the index number assigned to the writing destination block is obtained from the management table. The incoming data to be written is written into the temporary storage block indicated by the physical address.

8 Claims, 14 Drawing Sheets

(56) References Cited

U.S. PATENT DOCUMENTS

| | | | | |
|---|---|---|---|---|
| 6,389,514 B1* | 5/2002 | Rokicki | G06F 12/0215 | 365/230.03 |
| 6,421,769 B1* | 7/2002 | Teitenberg | G06F 12/1081 | 711/150 |
| 6,560,688 B1* | 5/2003 | Strongin | G06F 12/1027 | 345/568 |
| 6,643,452 B1* | 11/2003 | Ohbi | G11B 27/034 | 386/241 |
| 6,675,278 B1* | 1/2004 | Chowdhary | G06F 12/0238 | 711/103 |
| 6,931,509 B2* | 8/2005 | Lloyd-Jones | G06F 12/0238 | 711/206 |
| 2004/0030825 A1* | 2/2004 | Otake | G11C 8/12 | 711/105 |
| 2010/0058358 A1* | 3/2010 | Franke | G06F 12/1027 | 719/319 |
| 2011/0072028 A1* | 3/2011 | Rousseau | G06F 12/0246 | 707/758 |
| 2011/0299317 A1* | 12/2011 | Shaeffer | G11C 13/0002 | 365/106 |
| 2012/0131301 A1* | 5/2012 | Maeda | G06F 3/0611 | 711/171 |
| 2013/0246690 A1* | 9/2013 | Haneda | G06F 12/0246 | 711/103 |
| 2013/0322175 A1* | 12/2013 | Kong | G11C 16/10 | 365/185.11 |
| 2014/0089566 A1* | 3/2014 | Wu | G06F 12/0246 | 711/103 |
| 2014/0189202 A1* | 7/2014 | Hosaka | G06F 12/0246 | 711/103 |
| 2015/0356128 A1* | 12/2015 | Nishimura | G06F 16/2237 | 707/745 |
| 2016/0217177 A1* | 7/2016 | Niikura | G06F 16/2358 | |
| 2017/0010944 A1* | 1/2017 | Saito | G06F 3/0614 | |
| 2017/0046364 A1* | 2/2017 | Gajendran | G06F 16/211 | |
| 2017/0322843 A1* | 11/2017 | Hsu | G06F 3/0619 | |
| 2018/0189135 A1* | 7/2018 | Naik | G11C 16/3436 | |

* cited by examiner

FIG. 3

| ADDRESS CONVERSION TABLE TB1 | | |
|---|---|---|
| LOGICAL ADDRESS | PHYSICAL ADDRESS | INDEX NUMBER |
| 0x100 | 0 | 1 |
| 0x200 | 1 | 2 |
| 0x300 | 2 | 0 |
| | | |

FIG. 4

| TEMPORARY STORAGE BLOCK MANAGEMENT TABLE TB2 | | | |
|---|---|---|---|
| INDEX NUMBER | PHYSICAL ADDRESS | PAGE VALIDITY INFORMATION | PROGRESS INFORMATION |
| 1 | 3 | 110 | 1 |
| 2 | 4 | 100 | 3 |
| | | | |
| k | 0xFFFF | 000 | 0 |

FIG. 10

| TB1 | | |
|---|---|---|
| LOGICAL ADDRESS | PHYSICAL ADDRESS | INDEX NUMBER |
| 0x100 | 0 | 1 |
| 0x200 | 1 | 2 |

| TB2 | | | |
|---|---|---|---|
| INDEX NUMBER | PHYSICAL ADDRESS | PAGE VALIDITY INFORMATION | PROGRESS INFORMATION |
| 1 | 2 | 110 | 2 |
| 2 | 3 | 100 | 1 |
| 3 | 0xFFFF | 000 | 0 |
| 4 | 0xFFFF | 000 | 0 |

| LOGICAL ADDRESS | PHYSICAL ADDRESS | INDEX NUMBER |
|---|---|---|
| 0x100 | 0 | 1 |
| 0x200 | 1 | 2 |
| 0x300 | 2 | 3 |

TB2

| INDEX NUMBER | PHYSICAL ADDRESS | PAGE VALIDITY INFORMATION | PROGRESS INFORMATION |
|---|---|---|---|
| 1 | 3 | 110 | 2 |
| 2 | 4 | 100 | 4 |
| 3 | 5 | 100 | 1 |
| 4 | 0xFFFF | 000 | 0 |

| PHYSICAL ADDRESS | | | |
|---|---|---|---|
| 0 | B1 | P1 P2 P3 | d11 d12 d13 |
| 1 | B2 | P1 P2 P3 | d21 d22 d23 |
| 2 | B3 | P1 P2 P3 | d31 d32 d33 |
| 3 | B4 | P1 P2 P3 | d11a d12a |
| 4 | B5 | P1 P2 P3 | d21a |
| 5 | B6 | P1 P2 P3 | d31a |
| 6 | B7 | P1 P2 P3 | |

DA

METHOD FOR REWRITING DATA IN NONVOLATILE MEMORY AND SEMICONDUCTOR DEVICE

BACKGROUND

1. Field

The present invention relates to a method for rewriting data which is written in a memory, particularly in a nonvolatile memory, and to a semiconductor device which includes a nonvolatile memory.

2. Description of the Related Art

A NAND type flash memory (hereinafter referred to as NAND memory) as a nonvolatile semiconductor memory writes and reads data in increments of a page. The NAND memory erases data in increments of a block constituted by a plurality of pages.

In the NAND memory, data cannot be overwritten on a page with data written thereon. For example, rewriting of data is performed in a manner as follows (for example, Japanese Patent Application Laid-Open No. 2009-134682).

At first, incoming data to be written is written in a vacant block which is not written with data. Then, all data which is not to be rewritten is read out from a writing destination block which is specified by an address. The data which is read out is written in the vacant block with the incoming data to be written is written thereon. That block is set as an externally accessible block. The above data written in the writing destination block is erased so that a vacant block is obtained.

SUMMARY

In the method for data writing mentioned above, data is rewritten in increments of a block which is a unit of data erasing.

A copy process is needed as mentioned above in case volume of the incoming data to be written is lower than a memory capacity of a block. The copy process is to be performed by reading out all data which is not to be rewritten from the writing destination block and by writing that data in a vacant block. The data rewriting process takes long time.

It is therefore an object of the present invention is to provide a method for rewriting data in nonvolatile memory and semiconductor device which are capable of realizing data rewriting within shorter time.

A method for rewriting data in a nonvolatile memory according to the present invention is a method for rewriting data already written in a nonvolatile memory constituted by a plurality of blocks. The method for rewriting data comprises: data writing step, including receiving incoming data to be written as well as a logical address which indicates a writing destination block, while identifying a vacant block which is unwritten as a temporary storage block among the plurality of blocks when the writing destination block is written, and writing the incoming data to be written into the temporarily storage block; and managing step, including assigning an index number to a pair of the writing destination block and the temporarily storage block wherein the index number corresponds to the pair, and generating a management table which indicates the index number associating with a physical address indicating a physical position of the temporarily storage block in the nonvolatile memory.

In the data writing step, the physical address which corresponds to the index number assigned to the writing destination block is obtained from the management table, and the incoming data to be written is written into the temporary storage block indicated by the physical address.

A semiconductor device according to the present invention is a semiconductor device including a nonvolatile memory constituted by a plurality of blocks. The semiconductor device comprises: a data writing control part, configured to receive incoming data to be written as well as a logical address which indicates a writing destination block, to identify a vacant block which is unwritten as a temporary storage block among the plurality of blocks when the writing destination block is written, and to write the incoming data to be written to the temporary storage block; and a managing control part, configured to assign an index number to a pair of the writing destination block and the temporary storage block wherein the index number corresponds to the pair, and to generate a management table which indicates the index number corresponding to a physical address indicating a position of the temporary storage block in the nonvolatile memory. The data writing control part obtains the physical address which corresponds to the index number assigned to the writing destination block from the management table, and writes the incoming data to be written into the temporary storage block indicated by the physical address.

In the present invention, a vacant block with no data written thereon is identified as a temporary storage block at rewriting data which is written in a writing destination block specified by a logical address. Incoming data to be written is written in the temporary storage block. An index number is assigned to a pair of the writing destination block and the temporary storage block. The index number corresponds to that pair. A management table which indicates the index number associating with a physical address of the temporary storage block is generated.

A data piece after rewriting can be read out by referring to the index number from the management table even when only a part of data pieces in the block are rewritten.

In conventional method for rewriting data, a set of process is needed to be performed for rewriting a part of data pieces in a block. The set of process is composed of copying data except for the above data piece which is written in the writing destination block to the temporary storage block, and setting the temporary storage block to be in an externally accessible state. In the present invention, data can be rewritten within shorter time than in the conventional method.

In the conventional method, a plurality of the temporary storage blocks are to be managed when a plurality of blocks are target of data rewriting. In the present invention, the physical address can be obtained which indicates the temporary storage block which has become a target of an access among the plurality of temporary storage blocks by the index number.

It is therefore, the physical address indicating the temporary storage block which is a target of an accessing can be obtained more rapidly than in the conventional method. In the conventional method, the temporary storage block corresponding to the target of an accessing is searched by determining whether it is an object of accessing or not with respect to each of the plurality of temporary storage blocks.

Figure 2:
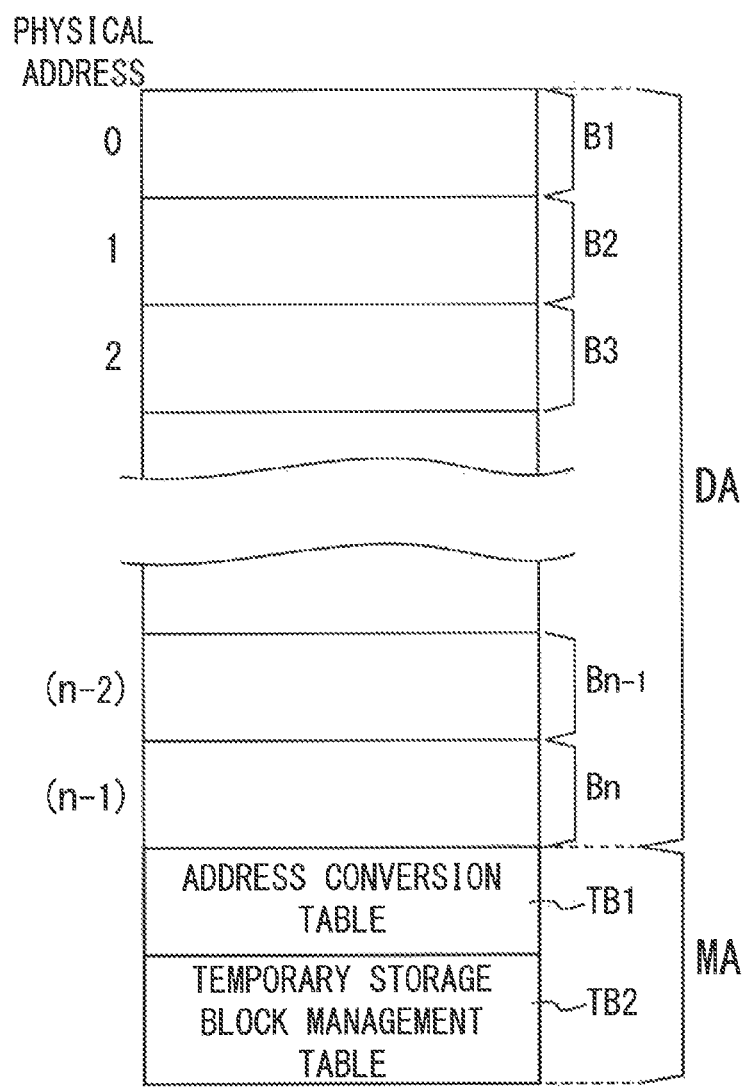
Figure 5:
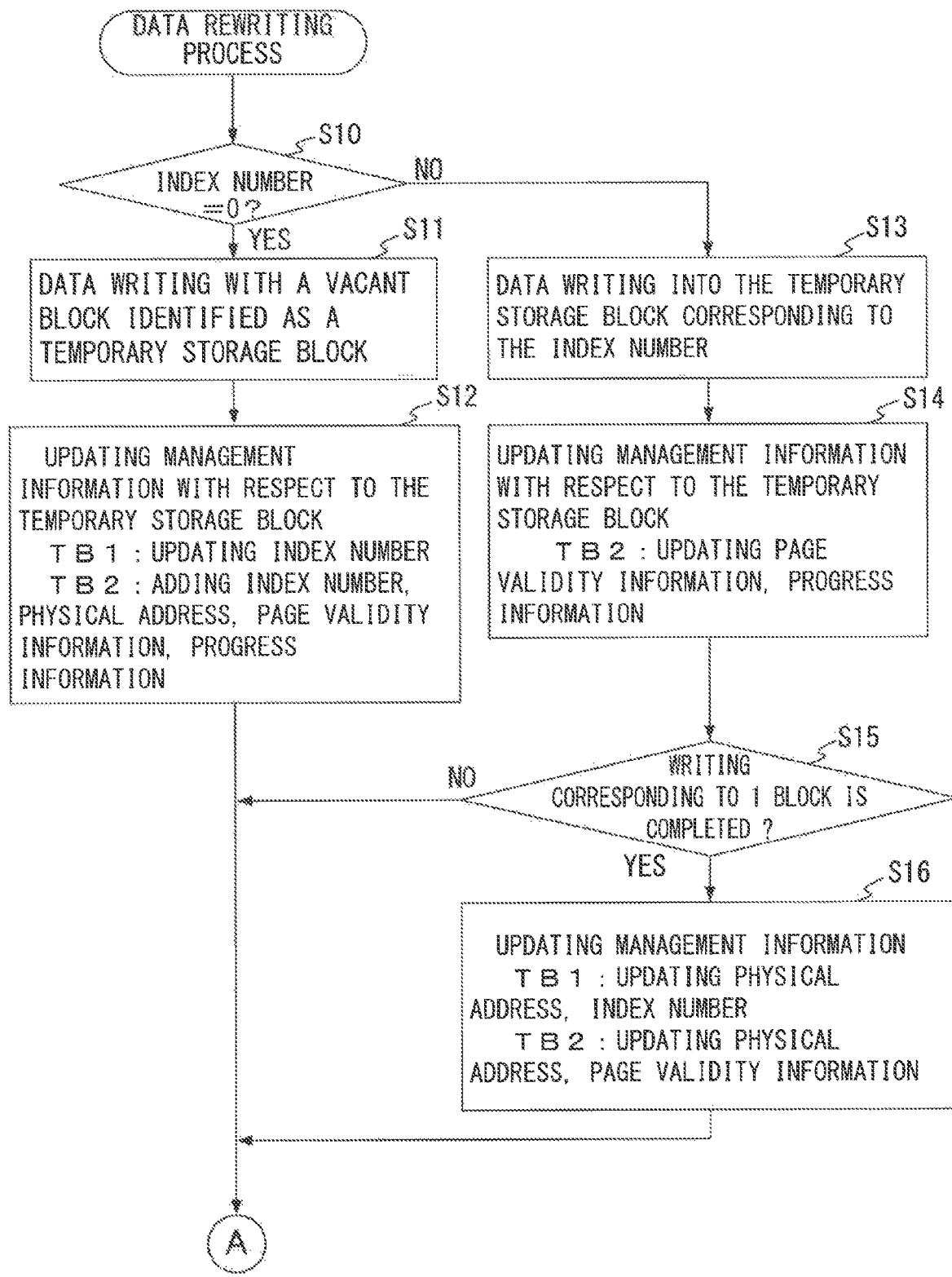
Figure 6:
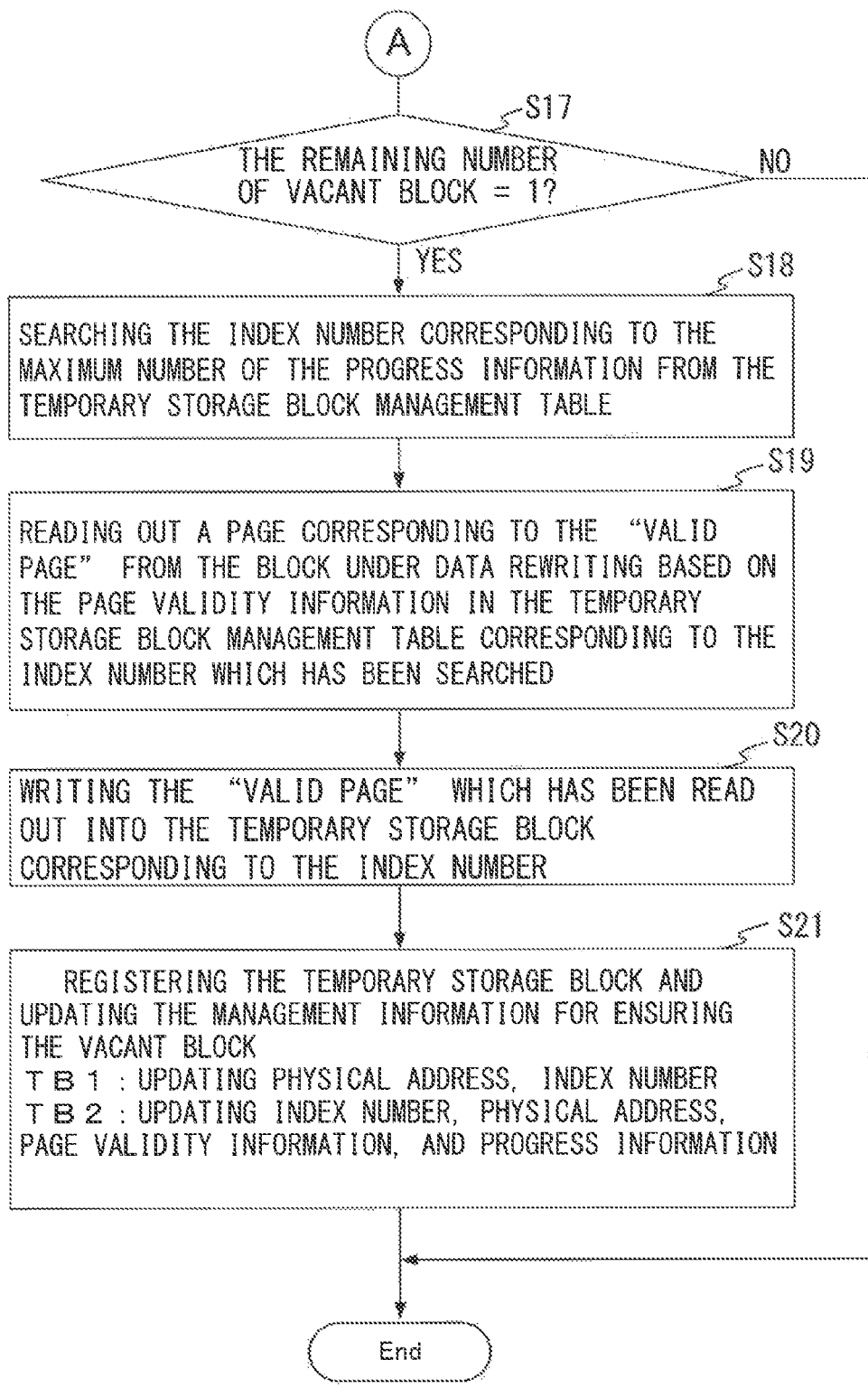
Figure 7:
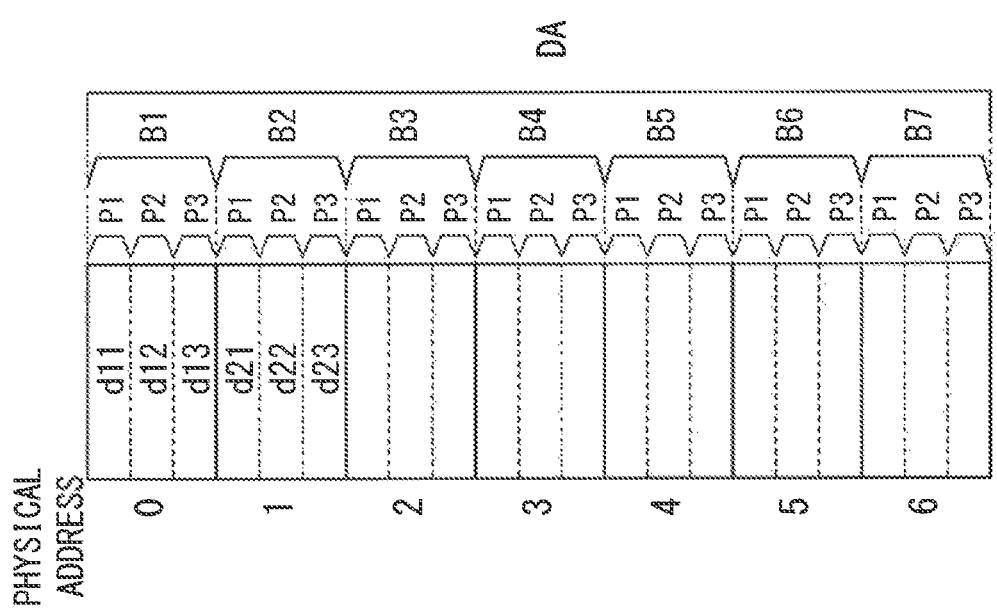
Figure 8:
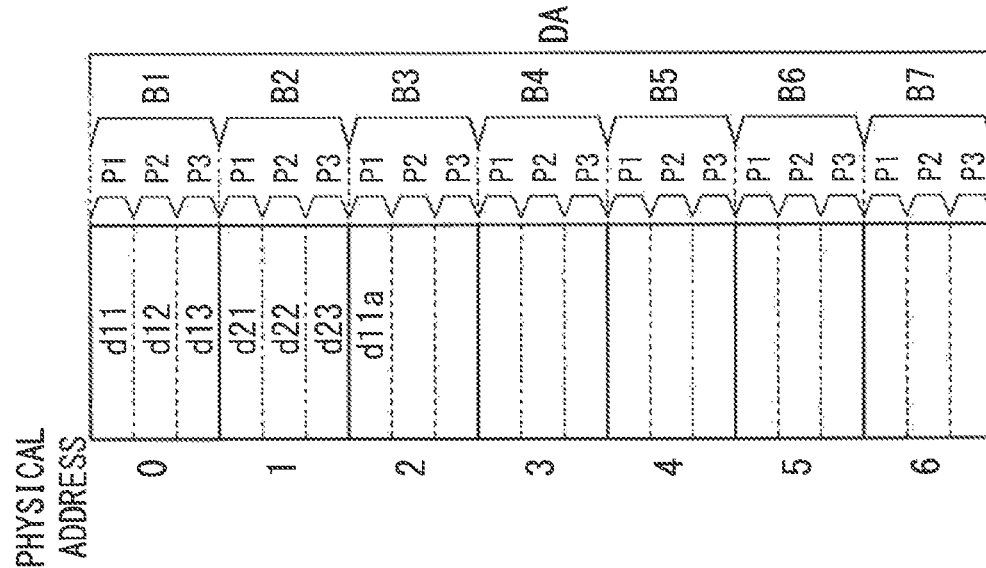
Figure 9:
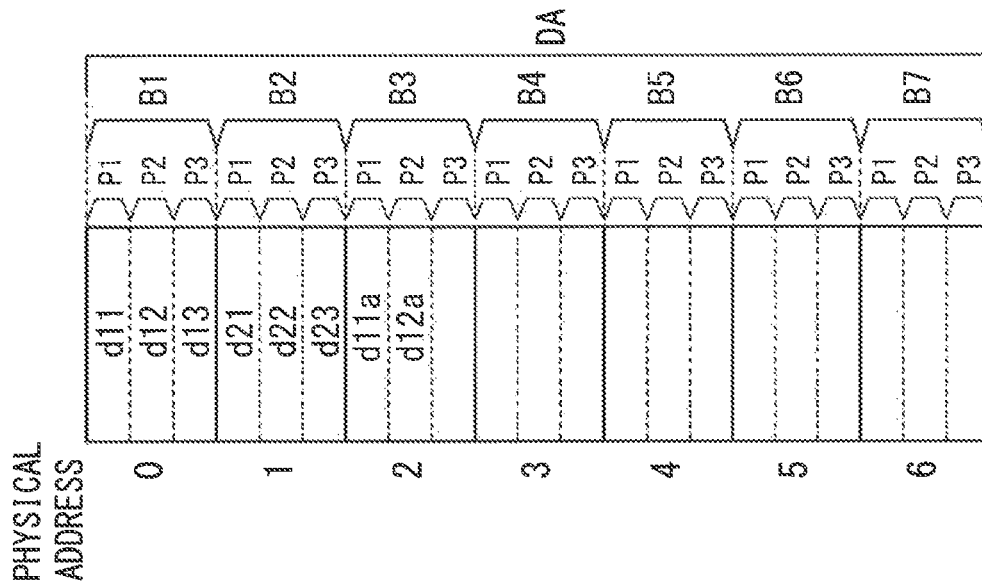
Figure 11:
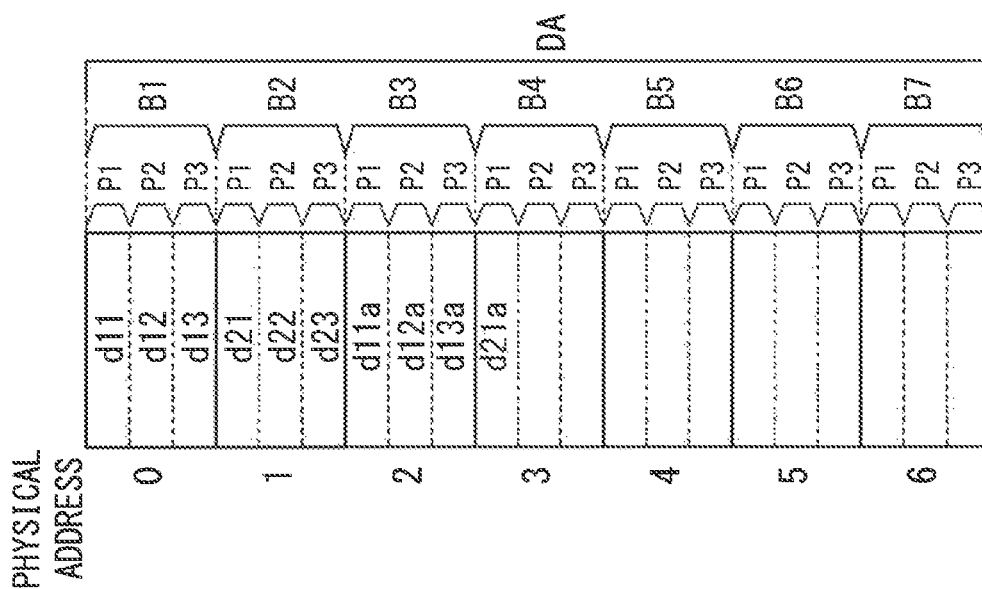
Figure 12:
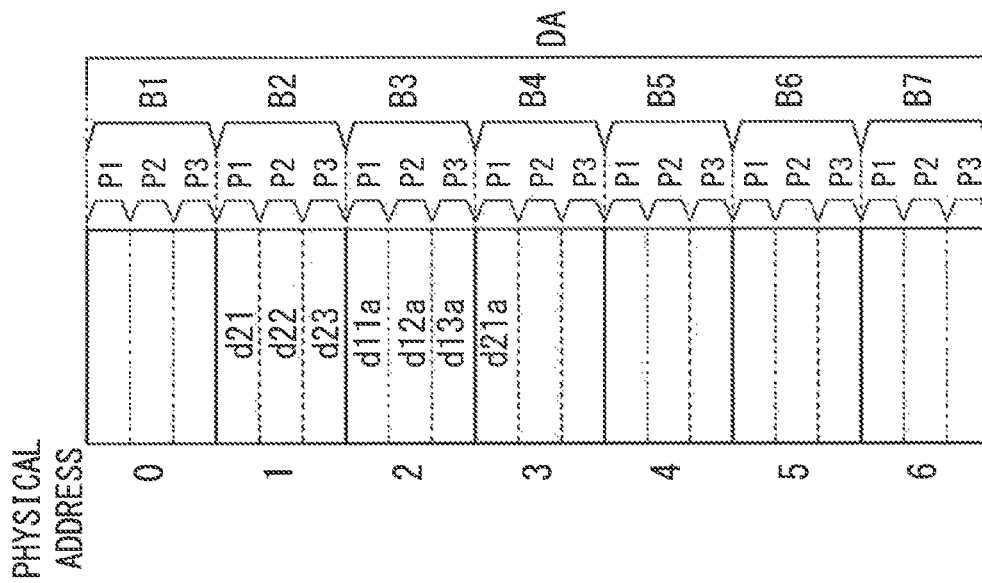
Figure 13:
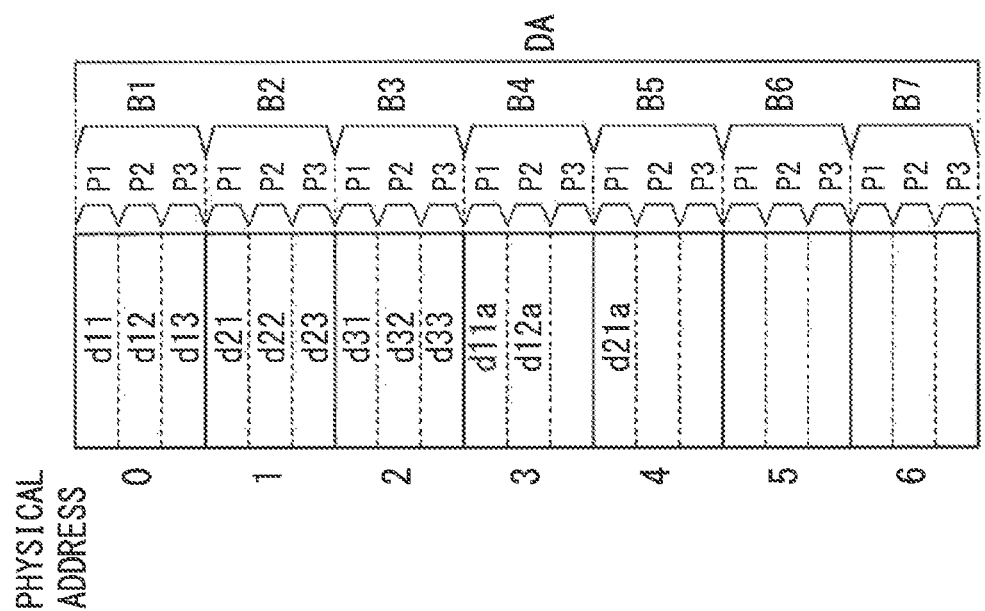
Figure 15:
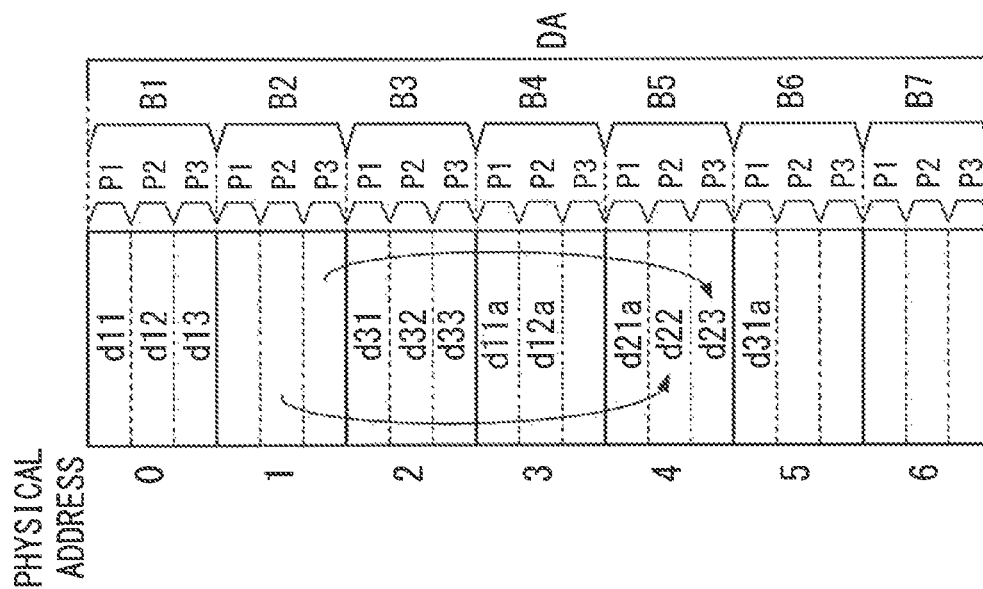

FIG. 2 is a schematic diagram illustrating segmentation of a storage area of a flash memory part 24;

FIG. 3 is a diagram showing an example of an address conversion table TB1;

FIG. 4 is a diagram showing an example of a temporary storage block management table TB2;

FIG. 5 is a diagram showing a flow chart showing a procedure for a data rewriting process;

FIG. 6 is a diagram showing a flow chart showing a procedure for a data rewriting process;

FIG. 7 is a diagram showing an example of a state of the flash memory part 24 at a stage of immediately before data rewriting;

FIG. 8 is a diagram showing an example of a state of the flash memory part 24 at a second stage of rewriting;

FIG. 9 is a diagram showing an example of a state of the flash memory part 24 at a third stage of rewriting;

FIG. 10 is a diagram showing an example of a state of the flash memory part 24 at a fourth stage of rewriting;

FIG. 11 is a diagram showing an example of a state of the flash memory part 24 at a fifth stage of rewriting;

FIG. 12 is a diagram showing an example of a state of the flash memory part 24 at a sixth stage of rewriting;

FIG. 13 is a diagram showing an example of a state of the flash memory part 24 when two vacant blocks are remained;

FIG. 14 is a diagram showing an example of a state of the flash memory part 24 when one vacant block is remained; and FIG. 15 is a diagram showing an example of register operation and securing vacant block operation which are performed when one vacant block is remained and a state of the flash memory part 24.

DETAILED DESCRIPTION OF THE INVENTION

An embodiment of the present invention will now be described below in detail with reference to the drawings.

Figure 1:
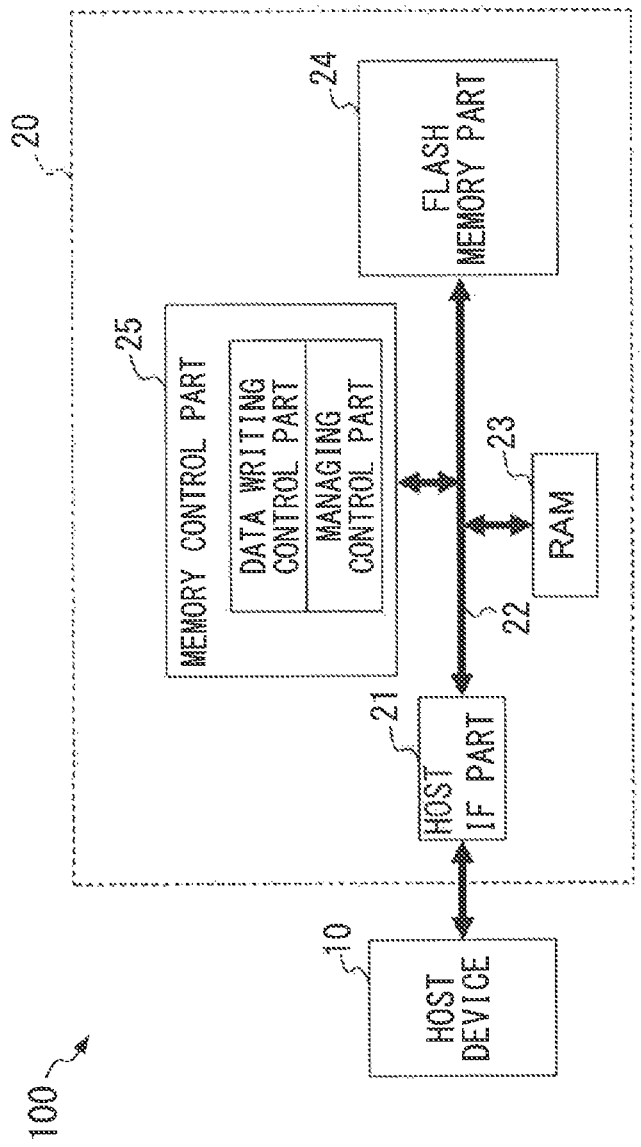
FIG. 1 is a block diagram showing a configuration of information processing system 100 having host device 10 and a nonvolatile memory 20 as a semiconductor device according to the present invention.

FIG. 1 is a block diagram showing a configuration of information processing system 100 having a host device 10 and a nonvolatile memory 20 as a semiconductor device according to the present invention.

The host device 10 performs information processing on the basis of data stored in the nonvolatile memory 20. The host device 10 supplies the nonvolatile memory 20 with a writing command, an address indicating writing destination, an incoming data to be written, a read out command, and an address for reading out.

The nonvolatile memory 20 has a host interface part 21 (hereinafter referred to as a host IF part 21), an internal bus 22, a RAM (Random Access Memory) 23, a flash memory part 24, and a memory control part 25.

The host IF part 21 supplies the internal bus 22 with the writing command, the address indicating writing destination and the incoming data to be written, or the read out command and the address for reading out which are supplied from the host device 10. The host IF part 21 supplies the host device 10 with read out data which is read out from the flash memory part 24.

RAM 23 stores the incoming data to be written which is supplied from the host device 10, the read out data which is read out from the flash memory part 24, and management information stored in the flash memory part 24.

The flash memory part 24 is a nonvolatile semiconductor memory such as a NAND type memory.

FIG. 2 is a schematic diagram illustrating segmentation of a storage area of the flash memory part 24. As shown in FIG. 2, the storage area of the flash memory part 24 includes a data area DA where data is written and a management area MA where management information is stored.

As shown in FIG. 2, the data area DA is segmented into n blocks B1 to Bn indicated by physical addresses "0"-"(n−1)" (n is an integer greater or equal to 2).

An address conversion table TB1 and a temporary storage block management table TB2 are stored in the management area MA.

FIG. 3 is a diagram showing an example of contents of the address conversion table TB1. As shown in FIG. 3, the physical addresses which indicate blocks in the flash memory part 24 are described in the address conversion table TB1 in association with logical addresses handled by the host device 10. The physical addresses which indicate blocks written with data among the physical addresses "0" to "(n−1)" are described in the address conversion table TB1.

Index numbers are described in the address conversion table TB1. The index numbers are associated with the physical addresses which indicate blocks written with data. Each of the index numbers is a number for recognizing a pair of a block under rewriting among the blocks written with data and a temporary storage block which is written with incoming data to be written instead of the block under rewriting. A default value (e.g., 0) is described uniformly corresponding to each block which is not under rewriting.

For example, "0" is written as an index number in the address conversion table TB1 in association with a physical address which indicates a block already written or completed with rewriting and is not under rewriting at present. Each index number which has a number different by block and greater than or equal to "1" is described in the address conversion table TB1 in association with each physical address which indicates a block under rewriting.

FIG. 4 is a diagram showing an example of contents of the temporary storage block management table TB2.

As shown in FIG. 4, the physical addresses which indicate the temporary storage block mentioned above, the index numbers mentioned above corresponding to the temporary storage block, page validity information, and progress information are described in the temporary storage block management table TB2.

An index number k (k is an integer) is described in the temporary storage block management table TB2. The index number k is obtained by adding "1" to the largest index number among the index numbers described in the address conversion table TB1. The index number k indicates a number to be used next. An unused address such as "0xFFFF" is described as a physical address corresponding to the index number k.

The page validity information shown in FIG. 4 is information which indicates whether a page is a "valid page" or an "invalid page" on a per-page basis by the logic level of each bit digit. The "valid page" is a data writable page because it is not yet written the data at present. The "invalid page" is a data unwritable page because it is already written the data.

An example of the page validity information is shown in FIG. 4. Three pages (hereinafter referred to as pages P1 to P3) are defined in each block. The logic level 0 indicates the "valid page" and the logic level 1 indicates the "invalid page".

For example, the page validity information which corresponds to the block B1 indicated by the physical address "0"

is 3-bit [110] in FIG. 4. The first bit of the page validity information is the logic level 1 which indicates the "invalid page" because the page P1 included in the block B1 is written with data. The second bit of the page validity information is the logic level 1 which indicates the "invalid page" because the page P2 included in the block B1 is written with data. The third bit of the page validity information is the logic level 0 indicating that the page P3 included in the block B1 is the "valid page" in which data is not updated.

The progress information in FIG. 4 is information which indicates a number of times that data writing is performed after data writing to the block corresponding to the index number in other blocks by each of the index numbers.

The management information which indicates the address conversion table TB1 and the temporary storage block management table TB2 is read out from the management area MA in the flash memory part 24 in response to the power supply and is stored in the RAM 23. The memory control part 25 performs updating and/or adding process described below to the management information (corresponding to TB1 and TB2) stored in the RAM 23. The memory control part 25 writes the management information finally obtained through the process, into the management area MA in the flash memory part 24, for example, at a timing of power shutdown such as system OFF of the device, at a timing that a state of the device becomes a sleep state, or at a timing of ending of a set of writing operations.

The memory control part 25, in response to a read out instruction and a logical address for reading out supplied from host device 10, reads out data corresponding to the logical address from flash memory part 24 in increments of a page. The memory control part 25 supplies the read out data to the host IF part 21 through internal bus 22.

The memory control part 25 writes the incoming data to be written into the flash memory part 24 in accordance with a write instruction supplied from the host device 100, incoming data to be written and a logical address which indicates the writing destination block.

The memory control part 25 writes the incoming data to be written in a block with no data written thereon (hereinafter referred to as vacant block) in the flash memory part 24 when the logical address which indicates the writing destination block is not described in the address conversion table TB1.

The memory control part 25 rewrites data by performing data rewriting process described below when the logical address which indicates the writing destination block is described in the address conversion table TB1.

FIG. 5 and FIG. 6 are flowcharts showing a procedure for the data rewriting process.

At first as shown in FIG. 5, the memory control part 25 imports index number corresponding to the logical address which indicates the writing destination block from the address conversion table TB1 and determines whether the index number is "0" or not (step S10). If it is determined that the index number is "0", the physical address corresponding to the index number indicates a block which is not under rewriting. If it is determined that the index number is a number other than "0", the physical address corresponding to the index number indicates a block which is under rewriting.

In the step S10, the memory control part 25 identifies one of the vacant blocks in the flash memory part 24 as a temporary storage block when it is determined that the index number is "0", and writes the incoming data to be written in the temporary storage block (step S11).

The memory control part 25 updates the management information (corresponding to TB1 and TB2) with respect to the temporary storage block after performing the step S11 (step S12).

For example, in the step S12, the memory control part 25 rewrites the index number corresponding to the logical address which indicates the writing destination block to a number other than "0" in the address conversion table TB1. For example, the number other than "0" is a number obtained by adding "1" to the largest index number among the index numbers described in the address conversion table TB1 at present. The memory control part 25 adds the rewritten index number to the temporary storage management table TB2 in association with above-mentioned physical address corresponding to the temporary storage block, the page validity information, and the progress information.

As the page validity information mentioned above, the logic level 1 is assigned to each bit digit corresponding to a page written with incoming data to be written in the temporary storage block. The logic level 0 is assigned to each bit digit corresponding to other page. Value "1" is assigned as the progress information corresponding to the index number which is rewritten in the step S12. Each value of the progress information corresponding to the index number other than the index number which is rewritten in the step S12 is added "1". Each value of the progress information corresponding to the unused index number maintains default value "0".

When it is determined that the index number is not "0" in the step S10, the memory control part 25 imports a physical address which corresponds to the index number from the temporary storage block management table TB2. The memory control part 25 writes the incoming data to be written into the block which is indicated by the physical address corresponding to that index number, in other words, into the temporary storage block (step S13).

After executing step S13, the memory control part 25 updates the management information (corresponding to TB2) with respect to the temporary storage block (step S14).

For example, in the step S14, the memory control part 25 updates the page validity information corresponding to the above index number in the temporary storage block management table TB2. The memory control part 25 rewrites the bit digit to the logic level 1. The bit digit is corresponding to the page written with the incoming data to be written in the step S13 among a bit group which indicates the page validity information. The value "1" is assigned to the progress information which corresponds to the index number corresponding to the temporary storage block written with the incoming data to be written in the step S11. The value of the progress information which corresponds to each of the index numbers other than the index number corresponding to the temporary storage block written with the incoming data to be written in the step S11 is increased by "1".

In the steps S12 and S14 as mentioned above, the memory control part 25 assigns an index number to a pair of the writing destination block and the temporary storage block. The index number corresponds to that pair. The memory control part 25 generates the management table (corresponding to TB1, TB2) which indicates the index number in association with the physical address indicating a physical position of the temporary storage block in the flash memory part 24.

After executing the step S14, the memory control part 25 determines whether writing of data corresponding to one block (corresponding to all pages) to the temporary storage block is completed or not based on the page validity information described in the temporary storage block management table TB2 (step S15). The memory control part 25 determines whether the logic level 1 is assigned to each of the all bits indicated by the page validity information or not. The memory control part 25 determines that the writing of data corresponding to one block (corresponding to all pages) is completed when the logic level 1 is assigned to each of the all bits.

In the step S15, the memory control part 25 updates the management information (corresponding to TB1, TB2) so as to secure a vacant block when it is determined that the writing of data corresponding to one block into the temporary storage block is completed (step S16).

For example, the memory control part 25 rewrites the physical address corresponding to the logical address indicating the writing destination block into the physical address of the temporary storage block as well as rewrites the index number into "0" in the address conversion table TB1, in the step S16. The memory control part 25 rewrites the physical address corresponding to the index number before rewriting in the temporary storage block management table TB2, in other words, the physical address indicating the writing destination block which is paired with the temporary storage block into the unused address [0xFFFF]. The memory control part 25 rewrites the page validity information corresponding to the index number before rewriting in the temporary storage block management table TB2 so as to indicate that all pages are valid for data writing.

The memory control part 25 executes the step S16 so as to set the temporary storage block to an externally accessible block instead of the writing destination block which is paired with the temporary storage block when the data writing with data corresponding to one block (corresponding to all pages) to the temporary storage block has been completed. The memory control part 25 sets the writing destination block which is paired with the temporary storage block to a vacant block.

After executing the step S12 or S16, or when it is determined that the writing of data corresponding to one block into the temporary storage block is not completed in the step S15, the memory control part 25 determines whether the remaining number of vacant block included in the data area DA is one or not (step S17).

The memory control part 25 searches the index number corresponding to the progress information which indicates a maximum value from the temporary storage block management table TB2 when it is determined in the step S17 that the remaining number of vacant block is one (step S18). The temporary storage block having the index number corresponding to the progress information which indicates the maximum value is a block which has passed the longest time, from the time point that the data rewriting was executed, among the temporary storage blocks described in the temporary storage block management table TB2.

The memory control part 25 obtains the physical address corresponding to the index number which has been searched in the step S18 from the address conversion table TB1. The memory control part 25 reads out non-updated data which is not a target of data rewriting from the block indicated by that physical address, in other words, the block under data rewriting. The memory control part 25 refers to the page validity information in the temporary storage block management table TB2 corresponding to the index number which has been searched in the step S18. The memory control part 25 reads out a page corresponding to the "valid page" from the block under data rewriting (step S19).

The memory control part 25 writes the non-updated data, in other words, the data which corresponds to the "valid page", into the block indicated by the physical address corresponding to the index number in the temporary storage block management table TB2, that is to say, into the temporary storage block (step S20).

The memory control part 25 registers the temporary storage block as an external accessible block and updates the management information (corresponding to TB1, TB2) for ensuring the vacant block (step S21).

For example, the memory control part 25 rewrites the physical address corresponding to the index number in the address conversion table TB1 into the physical address in the temporary storage block and rewrites the above index number into "0" in the step S21. The memory control part 25 rewrites the physical address corresponding to the index number before rewriting in the temporary storage block management table TB2 into the unused address [0xFFFF]. The memory control part 25 initializes the page validity information corresponding to the index number before rewriting in the temporary storage block management table TB2 so that the page validity information indicates that all pages are valid. The memory control part 25 initializes the progress information corresponding to the index number so that the progress information indicates "0". In the temporary storage block management table TB2, the memory control part 25 increases the progress information by "1" corresponding to each index number other than the index number corresponding to the block in which the non-updated data mentioned above is written.

The memory control part 25 executes steps S17 to S21 so as to set the temporary storage block to the externally accessible block when the remaining number of the vacant blocks becomes lower than the predetermined number, while setting the writing destination block paired with the temporary storage block to the vacant block. Any number may be set as the remaining number of the vacant block although it is explained in the step S17 of the above flow chart that the remaining number of the vacant block becomes 1.

After executing the step S21, or when it is determined that the remaining number of the vacant block is not 1 in the step S17, the memory control part 25 terminates the data rewriting process shown in FIG. 5 and FIG. 6.

Data rewriting operation will now be described below with illustrative embodiment. The data rewriting operation is performed by the memory control part 25 by executing the data rewriting process shown in FIG. 5 and FIG. 6.

FIG. 7 is a diagram showing an example of a state of the flash memory part 24 at a stage of immediately before data rewriting.

For example, data area DA of the flash memory part 24 is constituted by 7 blocks B1 to B7. Each block is constituted by 3 pages P1 to P3.

In the example shown in FIG. 7, the pages P1 to P3 in the block B1 of the flash memory part 24 are already written with data d11 to d13. The pages P1 to P3 in the block B2 are already written with data d21 to d23. Other blocks B3 to B7 are vacant blocks.

The physical address "0", corresponding to the block B1 in which the data d11 to d13 is written, as well as the logical address [0x100] are described being associated with each other in the address conversion table TB1, during the data area DA is in such a state as shown in FIG. 7. As shown in FIG. 7, the physical address "1", corresponding to the block B2 in which the data d21 to d23 is written, as well as the logical address [0x200] are described being associated with each other in the address conversion table TB1.

Any block under data rewriting is not exist just before executing data rewriting. As shown in FIG. 7, in the address conversion table TB1, the index number "0" is described being associated with each of the physical addresses "0" and "1" which indicate block B1 and block B2 respectively. For example, as shown in FIG. 7, blocks B3 to B7 which are vacant blocks are not described in the temporary storage block management table TB2 because the blocks B3 to B7 do not correspond to the temporary storage block at this stage.

A gradual statement transition of the flash memory part 24 will be described below showing an example that rewriting access is done from the host device 10. The rewriting access is to rewrite data d11-d13 and d21 which are having data capacity corresponding to one page in the following order so as to obtain data d11a-d13a and d21a.

[Rewriting Data d11 into d11a]

At first, the host device 10 supplies the logical address [0x100] indicating writing destination block and the data d11a as data to be written to the nonvolatile memory 20 along with a writing command so as to rewrite the data d11 into d11a.

The memory control part 25 obtains the index number which corresponds to the logical address [0x100] indicating the writing destination block from the address conversion table TB1 shown in FIG. 7. Because the index number is "0" as shown in FIG. 7, the memory control part 25 identifies the vacant block B3 as a temporary storage block among the vacant blocks B3-B7. As shown in FIG. 8, the memory control part 25 writes the data to be written d11a into the page P1 in that temporary storage block (S11).

The memory control part 25 rewrites the index number which corresponds to the logical address [0x100] described in the address conversion table TB1 into "1" as shown in FIG. 8 (S12).

The memory control part 25 describes the physical address "2" indicating the block B3 which is a temporary storage block, page validity information, and progress information in association with the index number "1" into the temporary storage block management table TB2 as shown in FIG. 8 (S12). As the progress information, [100] is described which indicates that only the page P1 is the "invalid page", and "1" is described as the page validity information.

[Rewriting Data d12 into d12a]

Then, the host device 10 supplies the logical address [0x100] indicating writing destination block and data d12a as data to be written to the nonvolatile memory 20 along with a writing command so as to rewrite the data d12 into d12a.

The memory control part 25 obtains the index number which corresponds to the logical address [0x100] indicating the writing destination block from the address conversion table TB1 shown in FIG. 8. Because the index number is "1" as shown in FIG. 8, the memory control part 25 obtains the physical address "2" corresponding to the index number "1", and the page validity information [100] from the temporary storage block management table TB2. The memory control part 25 writes the data d12a which is the data to be written into the page P2 which is a valid page in the block B3 as a temporary storage block indicated by the physical address "2" as shown in FIG. 9 (S13).

The memory control part 25 rewrites the page validity information corresponding to the index number "1" described in the temporary storage block management table TB2 into [110] which indicates that the pages P1 and P2 are the "invalid pages" and describes "1" as the progress information as shown in FIG. 9 (S14).

[Rewriting Data d21 into d12a]

Then, the host device 10 supplies the logical address [0x200] indicating writing destination block and data d21a as data to be written to the nonvolatile memory 20 along with a writing command so as to rewrite the data d21 into d21a.

The memory control part 25 obtains the index number which corresponds to the logical address [0x200] indicating the writing destination block from the address conversion table TB1 shown in FIG. 9. Because the index number is "0" as shown in FIG. 9, the memory control part 25 identifies the vacant block B4 as a temporary storage block among the vacant blocks B4-B7. The memory control part 25 writes the data d21a which is data to be written into the page P1 of the temporary storage block as shown in FIG. 10 (S11).

The memory control part 25 rewrites the index number corresponding to the logical address [0x200] described in the address conversion table TB1 into "2" as shown in FIG. 10 (S12).

Further, the memory control part 25 describes, in the temporary storage block management table TB2 as shown in FIG. 10, the physical address "3" indicating the block B4 which is a temporary storage block, the page validity information and the progress information in association with the index number "2" (S12). As the page validity information, [100] is described which indicates that only the page P1 is the "invalid page", and "1" is described as the progress information. The memory control part 25 increments the progress information corresponding to the index number "1" described in the temporary storage block management table TB2 from "1" to "2" by the data writing process to the block B4 corresponding to the index number "2".

[Rewriting Data d13 into d13a]

Then, the host device 10 supplies the logical address [0x100] indicating writing destination block and data d13a as data to be written to the nonvolatile memory 20 along with a writing command so as to rewrite the data d13 into d13a.

The memory control part 25 obtains the index number which corresponds to the logical address [0x100] indicating the writing destination block from the address conversion table TB1 shown in FIG. 10. Because the index number is "1" as shown in FIG. 10, the memory control part 25 obtains the physical address "2" corresponding to the index number "1" and the page validity information [110] from the temporary storage block management table TB2. The memory control part 25 writes the data d13a which is the data to be written into the page P3 which is a valid page in the block B3 as a temporary storage block indicated by the physical address "2" as shown in FIG. 11 (S13).

The memory control part 25 rewrites the page validity information corresponding to the index number "1" described in the temporary storage block management table TB2 into [111] which indicates that all of the pages P1-P3 are the "invalid pages" as shown in FIG. 11 (S14). The memory control part 25 increments the progress information corresponding to the index number "2" described in the temporary storage block management table TB2 from "1" to "2" by the data writing process to the block B3 corresponding to the index number "1" and describes "1" as the progress information corresponding to the index number "1".

By the set of process mentioned above, the page validity information corresponding to the index number "1" described in the temporary storage block management table TB2 becomes [111] indicating that all pages are the "invalid pages." Writing the data d11a-d13a corresponding to all contents (data d11-d13) of the block B1 which is to be rewritten in the block B3 as the temporary storage block is completed.

The memory control part 25 registers the temporary storage block as an external accessible block in the address conversion table TB1 and performs a management information update so as to ensure the block B1 which has been written with the rewriting target data as a vacant block (S16).

As shown in FIG. 12, the memory control part 25 rewrites the physical address which corresponds to the logical address [0x100] indicating the writing destination block B1 in the address conversion table TB1 into "2" indicating the block B3 as the temporary storage block. The memory control part 25 rewrites the index number which corresponds to the logical address [0x100] into "0" accompanied by such rewriting of the physical address.

Furthermore, the memory control part 25 rewrites the physical address corresponding to the index number "1" into [0xFFFF] indicating unused state so as to make the index number "1" in the temporary storage block management table TB2 unusable as shown in FIG. 12. The memory control part 25 rewrites the page validity information to the default value and the progress information to the default value "0" respectively in the temporary storage block management table TB2 accompanied by such rewriting of the physical address.

As shown in FIG. 12, the block corresponding to the logical address [0x100] is changed to the block B2 corresponding to the physical address "2". The block B1 corresponding to physical address "0" is set as a vacant block.

Such update process (S16) of the management information in order to ensure a vacant block accompanied by registering the temporary storage block as the externally accessible block mentioned above is also performed when the remaining number of the vacant block in the data are DA becomes a predetermined number, for example, "1" or less.

For example, as shown in FIG. 13, the memory control part 25 performs following processes in condition that the block B6 is used as a temporary storage block when two blocks B6 and B7 are remained in the data area DA.

In the example shown in FIG. 13, the blocks B1 to B3 are registered in the address conversion table TB1 as blocks can be accessed by the host device 10. In the example shown in FIG. 13, the blocks B1 and B2 are under rewriting. The data d11 and the data d12 written in the block B1 are the target of data rewriting. As shown in FIG. 13, the data d11a which is a rewritten data of the data d11 is written in the page P1 in the block B4 as a temporary storage block. The data d12a which is a rewritten data of the data d12 is written in the page P2 in the block B4. In the example shown in FIG. 13, the data d21 written in the block B2 is the target of data rewriting. The data d21a which is a rewritten data of the data d21 is written in the page P1 in the block B5.

The index number "1" associated with the physical address "0" indicating the Block B1 is described in the address conversion table TB1. The index number "2" associated with the physical address "1" indicating the Block B2 is described in the address conversion table TB1. At this stage, the index number "0" is described associated with the physical address "2" indicating the block B3 because the block B3 is not a block under rewriting.

As shown in FIG. 13, the physical address "3" indicating the block B4 and the page validity information [110] are described in the temporary storage block management table TB2 associated with the index number "1" corresponding to the block B1. In this example, the progress information corresponding to the index number "1" is indicated as "1".

In addition, the physical address "4" indicating the block B5 and the page validity information [100] are described in the temporary storage block management table TB2 in association with the index number "2" corresponding to the block B2. In this example, the progress information corresponding to the index number "2" is indicated as "3". In the example shown in FIG. 13, physical address [0xFFFF], page validity information [000] and progress information indicated as "0" is described in the temporary storage block management table TB2 in association with the index number "3" which is used in turn.

The host device 10 supplies the nonvolatile memory 20 with writing command, the logical address [0x300] indicating the block B3 and data to be written d31a so as to rewrite the data d31 written in the block B3 shown in FIG. 13.

The memory control part 25 obtains the index number "0" corresponding to the logical address [0x300] indicating the writing destination block from the address conversion table TB1 shown in FIG. 13. The memory control part 25 identifies the vacant block B6 as a temporary storage block and writes data to be written d31a into the page P1 of the temporary storage block as shown in FIG. 14 (S11).

The memory control part 25 rewrites the index number which corresponds to the logical address [0x300] described in the address conversion table TB1 from "0" to "3" as shown in FIG. 14 (S12).

As shown in FIG. 14, the memory control part 25 rewrites the physical address corresponding to the index number "3" in the temporary storage block management table TB2 from [0xFFFF] to "5", and rewrites the page validity information from [000] to [100] (S12). The memory control part 25 increases the progress information corresponding to the index number "1" from "1" to "2", and increases the progress information corresponding to the index number "2" from "3" to "4" because of the data writing to the block B6 as shown in FIG. 14 (S12).

As shown in FIG. 14, the number of vacant block in the data area DA becomes 1, that is, only the block B7, because the block B6 is used as a temporary storage block.

The memory control part 25 determines whether the remaining number of the vacant block in the data area DA is one or not (S17). The memory control part 25 performs the following processes when the number of remained vacant block becomes one.

At first, the memory control part 25 searches the index number "2" corresponding to the progress information indicating "4" which is the maximum number in the progress information corresponding to each index number from the temporary storage block management table TB2 shown in FIG. 14 (S18). Then, the memory control part 25 obtains the physical address "1" corresponding to that index number "2" from the address conversion table TB1 shown in FIG. 14 (S19). The memory control part 25 reads out data d22 and data d23 which are not updated and not the target of data rewriting corresponding to the "valid page" by the page validity information in the temporary storage block management table TB2 corresponding to the searched index number from the block B2 which is under data rewriting indicated by the physical address "1" (S19).

The memory control part 25 obtains the physical address "4" corresponding to the index number "2" from the temporary storage block management table TB2 shown in FIG. 14 (S20). Then, the memory control part 25 writes the above non-updated data d22 and data d23 as shown in FIG. 15 into the pages P2 and P3 in the temporary storage block B5 indicated by the physical address "4" (20).

The memory control part 25 registers the temporary storage block B5 as the externally accessible block and performs update of the management information so as to change the data rewriting target block B2 into a vacant block (S21).

In the address conversion table TB1, the memory control part 25 rewrites the physical address "1" corresponding to the index number "2" shown in FIG. 14 into "4" as shown in FIG. 15 and rewrites that index number "2" into "0".

The memory control part 25 rewrites the physical address corresponding to the index number "2" in the temporary storage block management table TB2 as shown in FIG. 15 into the address [0xFFFF] indicating unused state. As shown in FIG. 15, the memory control part 25 initializes the page validity information corresponding to the index number "2" in the temporary storage block management table TB2 into [000], and initializes the progress information into [0] respectively.

Furthermore, accompanied by the writing into the temporary storage block B5 mentioned above, the memory control part 25 increases the progress information corresponding to the index number "1" from "2" to "3", and increases the progress information corresponding to the index number "3" from "1" to "2" as shown in FIG. 15. It is therefore, the block corresponding to the logical address [0x200] is changed to the block B5 corresponding to the physical address "4". The block B2 is set as a vacant block.

As explained in detail above, the memory control part 25 performs rewriting of data by executing following data writing step and managing step in the nonvolatile memory 200.

In the data writing step (corresponding to S11, S13) the memory control part 25 receives incoming data to be written as well as the logical address which indicates the writing destination block, while identifying a vacant block which is unwritten as a temporary storage block among the plurality of blocks when the writing destination block is written, and writes the incoming data to be written, into the temporary storage block. In the managing step (corresponding to S12, S14), the memory control part 25 assigns an index number to each pair of the writing destination block and the temporarily storage block wherein the index number corresponds to the pair, and generates a management table (corresponding to TB1, TB2) which indicates the index number associating with a physical address indicating a physical position of the temporarily storage block in the nonvolatile memory. In the data writing step, the memory control part 25 obtains the physical address which corresponds to the index number assigned to the writing destination block from the management table, and writes the incoming data to be written into the temporary storage block indicated by the physical address.

Operations in the data writing step (corresponding to S11, S13) mentioned above may be executed by a writing control part which is a hardware included in the memory control part 25. Operations in the managing step (corresponding to S12, S14, S16, S21) may be executed by a managing control part which is a hardware included in the memory control part 25.

In the nonvolatile memory 200, at rewriting data already written in the writing destination block specified by the logical address, a vacant block which is not written with data is identified as the temporary storage block and the temporary storage block is written with the incoming data to be written. A pair of the writing destination block and the temporarily storage block is assigned with an index number which corresponds to the pair. The management table is generated which indicates the index number associating with a physical address of the temporarily storage block.

Even when a part of data pieces in a block is rewritten, a data piece which is rewritten with data can be read out by referring to the index number in the management table in response to external read out access.

In other words, the data piece which is rewritten with data can be read out without the set of process including copying data except for the data piece which is written in the writing destination block to the temporary storage block and setting the temporary storage block to be in an externally accessible state.

Therefore, according to the method for rewriting data in the nonvolatile memory 200, data can be rewritten in shorter time than the conventional method which needs copying process as well as setting process into the externally accessible state as mentioned above.

According to the nonvolatile memory 200, for example, in a TLC (triple Level Cell) system with a block size of 12 Mb, in case that the unit of writing (that is, page) is 4 Mb, data can be managed in increments of a page as a pseudo SLC (Single Level Cell) in which 1 block is divided by 4 Mb into three. In other words, in case a volume of writing data at once is less than whole data volume of one block, it is possible to manage a block which is under rewrite by the simulative SLC system.

According to the method for rewriting data, in case a plurality of blocks are the targets of data rewriting, a plurality of temporary storage blocks also become the targets of the management. In the present invention, the physical address indicating the temporary storage block which is a target of access can be obtained by using the index number from among the plurality of temporary storage block. Therefore, the physical address indicating the temporary storage block which is a target of access can be obtained faster than searching the temporary storage block which corresponds to a target of access by determining whether the target of access or not with respect to each of the plurality of temporary storage blocks.

In the above-mentioned embodiment, when the remaining number of the vacant block becomes one, the management process (S18-S21) is performed registering the temporary storage block as the externally accessible block as well as ensuring a vacant block. However, a condition that such management process is performed is not limited to that the remaining number of the vacant block becomes one. In sum, it is merely required that the above-mentioned management process (S18-S21) is performed when the remaining number of the vacant block becomes equal to or lower than a predetermined number.

In the above-mentioned embodiment, in registering the temporary storage block as the externally accessible block, the condition is set to the largest number of times that the data is rewritten in the other temporary storage blocks which is indicated by the process information so as to choose the temporary storage block which is the target of the registering. However, it may be adopted that measuring an elapsed time period from a point where the temporary storage block has been written with data to a point where a data writing succeeding to the previous data writing for each of the temporary storage blocks. A temporary storage block with the longest elapsed time period may be registered as the externally accessible block.

In the above-mentioned embodiment, in the step S15 shown in FIG. 5, the memory control part 25 determines whether the logic level 1 is assigned to each of the all bits indicated by the page validity information or not so as to determine whether the data writing corresponding to 1 block is completed or not. However, it may be determined in the step S15 whether the storage volume of the incoming data to be written which is written in the temporary storage block becomes equal to the memory capacity of the temporary storage block or not.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2017-198586 filed on Oct. 12, 2017, the entire contents of which are incorporated herein by reference.

What is claimed is:

1. A method for rewriting data already written in a nonvolatile memory constituted by a plurality of blocks comprising:

data writing step, including receiving incoming data to be written as well as a logical address which indicates a writing destination block, while identifying a vacant block which is unwritten as a temporary storage block among said plurality of blocks when said writing destination block is written, and writing said incoming data to be written into said temporarily storage block; and managing step, including assigning an index number to a pair of said writing destination block and said temporarily storage block wherein the index number corresponds to the pair, and generating a management table which indicates said index number associating with a physical address indicating a physical position of said temporarily storage block in said nonvolatile memory, wherein said data writing step, said physical address which corresponds to said index number assigned to said writing destination block is obtained from said management table, and said incoming data to be written is written into said temporary storage block indicated by said physical address.

2. The method for rewriting data already written in a nonvolatile memory according to claim 1 wherein in said data writing step, after a first incoming data to be written is written in said temporary storage block which is paired with said writing destination block indicated by said logical address, in case of receiving a second incoming data to be written and said logical address which indicates said writing destination block paired with said temporary storage block in which said first incoming data to be written is written, said second incoming data to be written is written into said temporary storage block in which said first incoming data to be written is written.

3. The method for rewriting data already written in a nonvolatile memory according to claim 1 wherein said managing step, when a storage volume of said incoming data to be written which is written in said temporary storage block becomes equal to a memory capacity of said temporary storage block, said temporary storage block is set to an externally accessible block instead of said writing destination block paired with said temporary storage block.

4. The method for rewriting data already written in a nonvolatile memory according to claim 3 wherein said managing step, said writing destination block paired with said temporary storage block is set to said vacant block.

5. The method for rewriting data already written in a nonvolatile memory according to claim 4 wherein said managing step, a physical address corresponding to said logical address which indicates said writing destination block is changed to a physical address of said temporary storage block, and a physical address of said writing destination block paired with said temporary storage block is changed to an unused address.

6. The method for rewriting data already written in a nonvolatile memory according to claim 1 wherein said managing step, when a remaining number of said vacant block among said plurality of blocks becomes lower than a predetermined number, said temporary storage block is set to an externally accessible block and said writing destination block paired with said temporary storage block is set to said vacant block.

7. The method for rewriting data already written in a nonvolatile memory according to claim 6 wherein said managing step, for each of said index numbers, progress information indicating a number of times that the data writing is performed after writing of said incoming data to be written into said temporary storage block corresponding to that index number in the other temporary storage block is described in said management table associated with said index numbers, said temporary storage block corresponding to said index number which is associated with said progress information indicating the maximum said number of times is set to an externally accessible block.

8. A semiconductor device including a nonvolatile memory constituted by a plurality of blocks comprising:

a data writing control part, configured to receive incoming data to be written as well as a logical address which indicates a writing destination block, to identify a vacant block which is unwritten as a temporary storage block among said plurality of blocks when said writing destination block is written, and to write said incoming data to be written to said temporary storage block; and a managing control part, configured to assign an index number to a pair of said writing destination block and said temporary storage block wherein the index number corresponds to the pair, and to generate a management table which indicates said index number corresponding to a physical address indicating a position of said temporary storage block in said nonvolatile memory, wherein said data writing control part obtains said physical address which corresponds to said index number assigned to said writing destination block from said management table, and writes said incoming data to be written into said temporary storage block indicated by said physical address.

* * * * *